(12) United States Patent
Lin et al.

(10) Patent No.: US 9,559,326 B2
(45) Date of Patent: Jan. 31, 2017

(54) LIGHT EMITTING ELEMENT

(71) Applicant: Industrial Technology Research Institute, Chutung, Hsinchu County (TW)

(72) Inventors: Yi-Ping Lin, Chutung (TW); Jung-Yu Li, Chutung (TW); Guan-Yu Chen, Chutung (TW); Shih-Pu Chen, Chutung (TW); Jin-Han Wu, Chutung (TW); Cheng-Chang Chen, Chutung (TW)

(73) Assignee: Industrial Technology Research Institute, Chutung, Hsinchu County (TW)

( * ) Notice: Subject to any disclaimer, the term of this patent is extended or adjusted under 35 U.S.C. 154(b) by 0 days.

(21) Appl. No.: 14/793,011

(22) Filed: Jul. 7, 2015

(65) Prior Publication Data
US 2016/0218313 A1 Jul. 28, 2016

(30) Foreign Application Priority Data
Jan. 26, 2015 (TW) .............................. 104102492 A
Apr. 17, 2015 (TW) .............................. 104112374 A

(51) Int. Cl.
*H01L 35/24* (2006.01)
*H01L 51/52* (2006.01)

(52) U.S. Cl.
CPC ....... *H01L 51/5209* (2013.01); *H01L 51/5225* (2013.01)

(58) Field of Classification Search
None
See application file for complete search history.

(56) References Cited

U.S. PATENT DOCUMENTS 5,707,745 A 1/1998 Forrest et al.
5,811,833 A 9/1998 Thompson
(Continued)

FOREIGN PATENT DOCUMENTS

CN 1551689 A 12/2004
CN 102104101 A 6/2011
(Continued)

OTHER PUBLICATIONS

CN102956838 English Abstract.
(Continued)

*Primary Examiner* — Jack Chen
(74) *Attorney, Agent, or Firm* — McCarter & English, LLP; Yu Lu

(57) ABSTRACT

A light emitting element is disclosed, including a substrate layer, a first metal layer and a second metal layer stacked sequentially on the substrate layer, and an organic material layer disposed between the first metal layer and the second metal layer. The first metal layer includes a first metal portion and a second metal portion that cover a surface of the substrate layer, and an opening portion disposed between the first metal portion and the second metal portion and exposes a portion of the surface. The organic material layer emits light having a wavelength within a first range. A first coupling generated between the first metal portion and the second metal layer shifts the light from the first range to a second range. A second coupling generated between the second metal portion and the second metal layer shifts the light from the first range to a third range.

11 Claims, 13 Drawing Sheets

(56) References Cited

U.S. PATENT DOCUMENTS

| | | |
|---|---|---|
| 6,670,772 B1 | 12/2003 | Arnold et al. |
| 7,247,394 B2 | 7/2007 | Hatwar et al. |
| 8,269,214 B2 | 9/2012 | Smigelski, Jr. et al. |
| 8,304,796 B2 | 11/2012 | Fukuda |
| 8,415,875 B2 | 4/2013 | Smith et al. |
| 8,618,729 B2 | 12/2013 | Frischeisen et al. |
| 2003/0030370 A1 | 2/2003 | Tada |
| 2005/0280008 A1 | 12/2005 | Ricks et al. |
| 2008/0272690 A1 | 11/2008 | Kuma et al. |
| 2011/0151605 A1 | 6/2011 | Yoon |
| 2012/0032138 A1 | 2/2012 | Kim et al. |
| 2012/0235197 A1 | 9/2012 | Okuyama |
| 2014/0183464 A1 | 7/2014 | Baek et al. |
| 2015/0236290 A1* | 8/2015 | Li .................. H01L 51/5209 257/40 |
| 2016/0049608 A1 | 2/2016 | Hack et al. |
| 2016/0218313 A1* | 7/2016 | Lin .................. H01L 51/5225 |

FOREIGN PATENT DOCUMENTS

| | | |
|---|---|---|
| CN | 102956838 A | 3/2013 |
| TW | 200519413 | 6/2005 |
| TW | I304707 B | 12/2008 |
| TW | I406587 B | 8/2013 |
| TW | 201403901 A | 1/2014 |
| TW | 201419521 A | 5/2014 |
| TW | 201431853 A | 8/2014 |
| TW | 201436334 A | 9/2014 |
| TW | 201444077 A | 11/2014 |

OTHER PUBLICATIONS

TWI304707 English Abstract.
TWI406587 English Abstract.
TW201419521 English Abstract.
TW201431853 English Abstract.
TW201436334 English Abstract.
TW201444077 English Abstract.
Feng et al., "Enhancement of electroluminescence through a two-dimensional corrugated metal film by grating induced surface-plasmon cross coupling," *Optics Letters*, 30(17):2302-2304 (2005).
Koller et al., "Surface plasmon coupled electroluminescent emission," *Applied Physics Letters*, 92:103304-1-103304-3 (2008).
Koo et al., "Light extraction from organic light-emitting diodes enhanced by spontaneously formed buckles," *Nature Photonics*, 4:222-226 (2010).
Wedge et al., "Surface plasmon polariton mediated emission of light from top-emitting organic light-emitting diode type structures," *Organic Electronics*, 8:136-147 (2007).
Yates et al., "Surface plasmon-polariton mediated emission from phosphorescent dendrimer light-emitting diodes," *Applied Physics Letters*, 88:161105:1-161105-3 (2006).
CN102104101 English abstract.
CN1551689(A) English abstract.
TW200519413 English abstract.
TW201403901(A) English abstract.

\* cited by examiner

LIGHT EMITTING ELEMENT

CROSS-REFERENCE TO RELATED APPLICATIONS

This application claims foreign priority under 35 U.S.C. §119(a) to patent application No. 104102492, filed on Jan. 26, 2015, and application No. 104112374, filed on Apr. 17, 2015, both in the Intellectual Property Office of Ministry of Economic Affairs, Republic of China (Taiwan, R.O.C.), the entire contents of both patent applications are incorporated herein by reference.

FIELD OF THE DISCLOSURE

The present disclosure relates to light emitting element, and, more particularly, to an organic light emitting element.

BACKGROUND OF THE INVENTION

Generally, an LED (Light Emitting Diode) consists of a semiconductor material doped with impurities to form p-type and n-type semiconductors. The p-type and n-type semiconductors are further combined to form a pn junction. Holes and electrons can be injected from the p-type and n-type semiconductors, respectively. When injected holes and electrons recombine at the pn junction, energy is released in the form of photons.

Organic light emitting diodes (OLEDs) uses an organic material. The OLED operates as follows. When a forward biased voltage is applied to the OLED, electrons and holes are injected from a cathode and an anode, respectively, and excitons are formed in a light emitting layer through recombination of electrons and holes. Radiative decay of the excitons results in light emission. Further, the light emitting layer is doped with a fluorescent or phosphorescent light-emitting guest material to improve the luminous efficiency and prolong the lifetime of the OLED.

In recent years, a great progress has been made on the luminous efficiency and lifetime of red, green and blue light emitting materials of OLEDs, especially green light emitting materials. However, blue light emitting materials show a relatively inferior performance in comparison with green or red light emitting materials. Although blue phosphorescent materials have a luminous efficiency of about 20.4 cd/A, they have a short lifetime of several hundred hours.

Therefore, there is a need to develop a high-efficiency white OLED that circumvents the use of blue phosphorescent/fluorescent materials).

SUMMARY OF THE INVENTION

The present disclosure proposes a light emitting element, which may include: a substrate layer including a surface; a first metal layer formed on the surface of the substrate layer and including a first metal portion and a second metal portion that cover a portion of the surface of the substrate layer and an opening portion that is formed between the first metal portion and the second metal portion and exposes a remaining portion of the surface; an organic material layer formed on the first metal portion, the second metal portion, and the remaining portion of the surface that is exposed from the opening portion; and a second metal layer formed on the organic material layer, such that the organic material layer is disposed between the first metal layer and the second metal layer, wherein the organic material layer emits light that has a peak wavelength within a first range, a first coupling is generated between the first metal portion and the second metal layer and shifts the peak wavelength of the light from the first range to a second range, and a second coupling is generated between the second metal portion and the second metal layer and shifts the peak wavelength of the light from the first range to a third range.

A light emitting element may include: a substrate layer; a first metal layer formed on the substrate layer; an organic material layer formed on the first metal layer, such that the first metal layer is disposed between the substrate layer and the organic material layer; and a second metal layer formed on the organic material layer, such that the organic material layer is disposed between the first metal layer and the second metal layer, wherein the organic material layer emits light that has a peak wavelength within a first range, and a coupling is generated between the first metal layer and the second metal layer and shifts the peak wavelength of the light from the first range to a second range.

A light emitting element may include: a substrate layer; a first metal layer formed on the substrate layer; a first organic material layer formed on the first metal layer, such that the first metal layer is disposed between the substrate layer and the first organic material layer; a second metal layer formed on the first organic material layer, such that the first organic material layer is disposed between the first metal layer and the second metal layer; a second organic material layer formed on the second metal layer, such that the second metal layer is disposed between the first organic material layer and the second organic material layer; a third metal layer formed on the second organic material layer, such that the second organic material layer is disposed between the second metal layer and the third metal layer; a third organic material layer formed on the third metal layer, such that the third metal layer is disposed between the second organic material layer and the third organic material layer; and a fourth metal layer formed on the third organic material layer, such that the third organic material layer is disposed between the third metal layer and the fourth metal layer, wherein the first organic material layer emits first light, the second organic material layer emits second light, the third organic material layer emits third light, the first, the second and the third light have their peak wavelengths within a first range, a second coupling is generated between the second metal layer and the third metal layer and shifts the peak wavelength of the second light from the first range to a second range, and a third coupling is generated between the third metal layer and the fourth metal layer and shifts the peak wavelength of the third light from the first range to a third range.

A light emitting element may include a plurality of pixels, each pixel comprising: a substrate layer including a surface; a first metal layer formed on the surface of the substrate layer; an organic material layer formed on the first metal layer, such that the first metal layer is disposed between the substrate layer and the organic material layer; and a second metal layer formed on the organic material layer, such that the organic material layer is disposed between the first metal layer and the second metal layer, wherein the organic material layer of each of the pixels emits light that has a peak wavelength within a first range, the first metal layer and the second metal layer, which are spaced apart by the organic material layer, generate a coupling such that the peak wavelength of the light is shifted, wherein each of the pixels further has one of the following structures: the first metal layer covers the surface completely, the peak wavelength of the light is shifted from the first range to a second range by adjusting a thickness of the first metal layer to be less or a distance between the first metal layer and the second metal layer to be greater, or the peak wavelength of the light is shifted from the first range to a third range by adjusting the thickness of the first metal layer to be greater or the distance between the first metal layer and the second metal layer to be less; the first metal layer has a metal portion that covers a portion of the surface of the substrate layer and an open portion that exposes a remaining portion of the portion; the peak wavelength of the light is shifted from the first range to the second range by adjusting a thickness of the metal portion to be less or a distance between the metal portion and the second metal layer to be greater, or the peak wavelength of the light is shifted from the first range to the third range by adjusting the thickness of the metal portion to be greater or the distance between the metal portion and the second metal layer to be less; the first metal layer has a first metal portion and a second metal portion that cover the surface of the substrate layer, the peak wavelength of the light is shifted from the first range to the second range by adjusting a thickness of the first metal portion to be less or a distance between the first metal portion and the second metal layer to be greater, or the peak wavelength of the light is shifted from the first range to the third range by adjusting a thickness of the first metal portion to be greater or a distance between the first metal portion and the second metal layer to be less; and the first metal layer has a first metal portion, a second metal portion, and an open portion formed between the first metal portion and the second metal portion for exposing a portion of the surface of the substrate layer, the peak wavelength of the light is shifted from the first range to the second range by adjusting a thickness of the first metal portion to be less or a distance between the first metal portion and the second metal layer to be greater, or the peak wavelength of the light is shifted from the first range to the third range by adjusting the thickness of the first metal portion to be greater or the distance between the first metal portion and the second metal layer to be less.

BRIEF DESCRIPTION OF THE DRAWINGS

The present disclosure can be more fully understood by reading the following detailed description of the preferred embodiments, with reference made to the accompanying drawings.

DETAILED DESCRIPTION OF THE EMBODIMENTS

Figure 1:
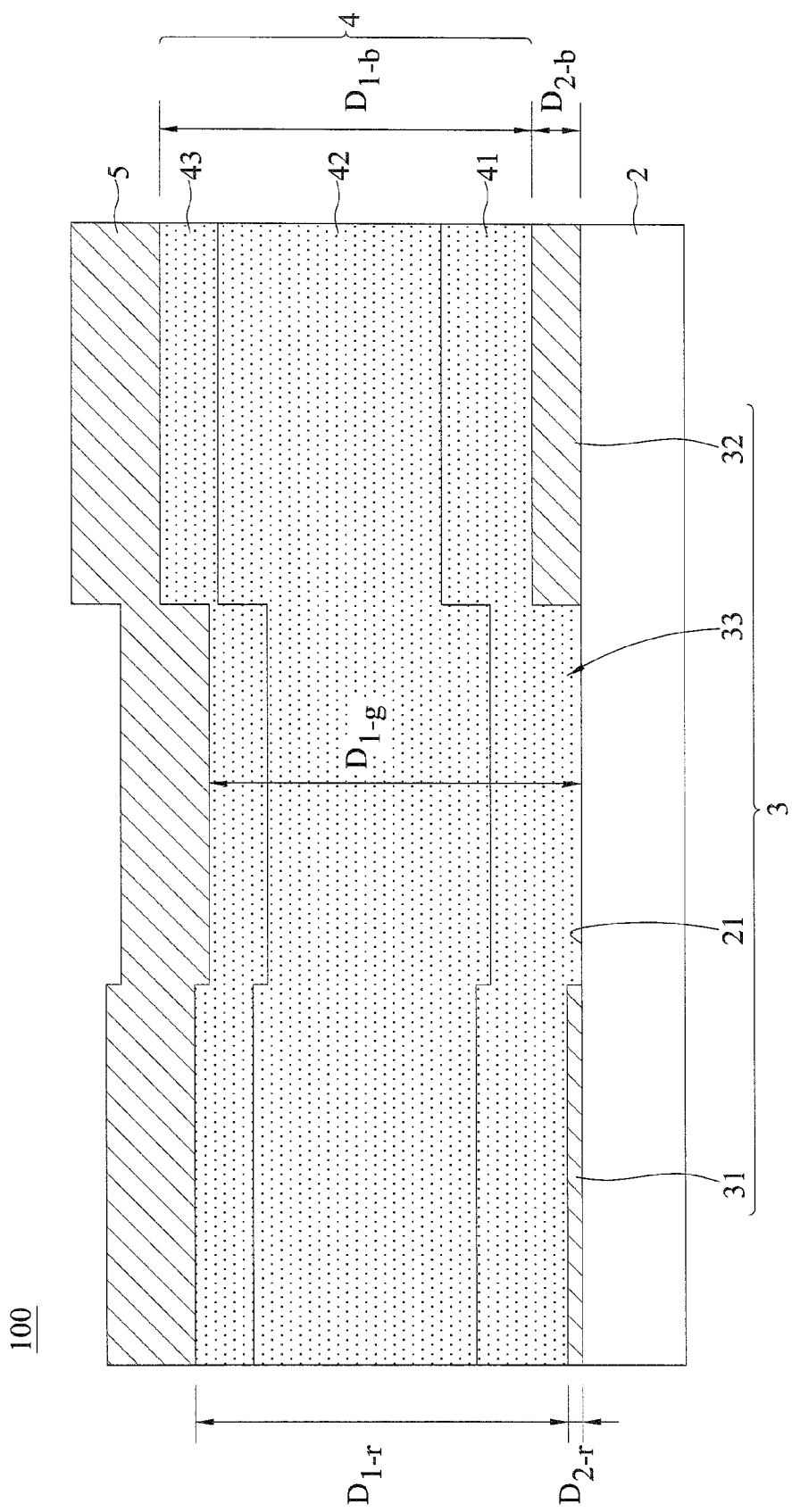
FIGS. 1 to 3 are schematic diagrams illustrating different aspects of a light emitting element in accordance with a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
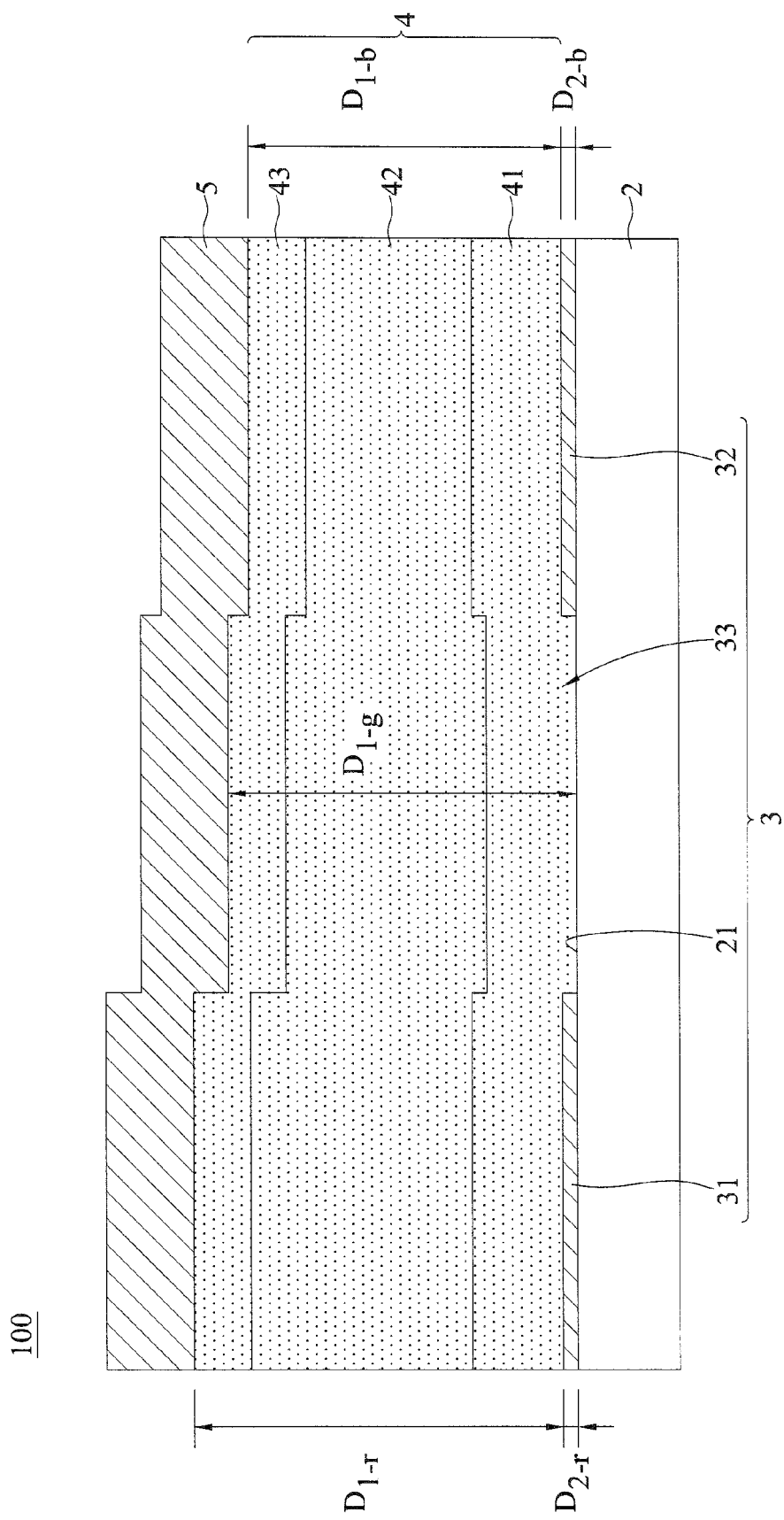
Figure 3:
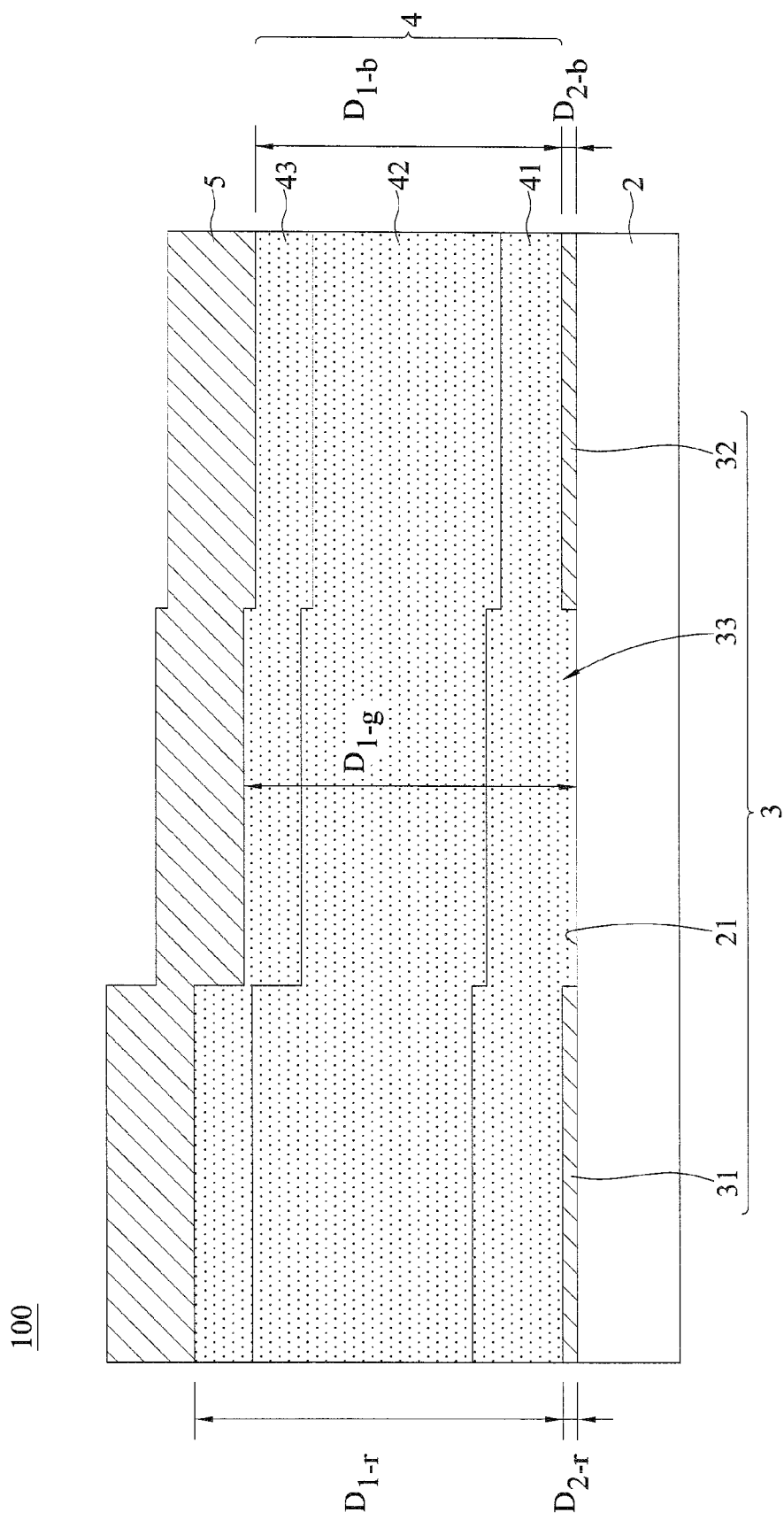

Referring to FIGS. 1 to 3, schematic diagrams illustrating three aspects of a light emitting element in accordance with a first embodiment of the present disclosure are shown. A light emitting element 100 includes a substrate layer 2, a first metal layer 3, an organic material layer 4, and a second metal layer 5 sequentially stacked.

The substrate layer 2 has a surface 21. The material of the substrate layer 2 in the present embodiment may be glass, plastic, or conductive metal oxide, such as indium tin oxide (ITO) or indium zinc oxide (IZO). The substrate layer 2 is used as the anode when the substrate 2 is ITO or IZO.

The first metal layer 3 may be a patterned metal layer or a grid-like metal layer, including metal portions 31 and 32 that cover the surface 21 and an opening portion 33 disposed between the metal portions 31 and 32 and exposes a portion the surface 21.

The material of the first metal layer 3 in this embodiment may be metal (e.g., aluminum or its alloy, silver or its alloy, gold or its alloy), such as Al/LiF, Ag/Al/Ag, Ag/Ge/Ag, or nano metal oxide, such as $BCP/V_2O_5$, $MoO_3$, $ZnS/Ag/ZnO/Ag$, $ZnPc/C_{60}$. Alternatively, it may include a nano metal wire. In an embodiment, the first metal layer 3 is used as an electrode, such as an anode or a cathode. In this embodiment, the thickness of the first metal layer 3 may be approximately between 5 nm to 20 nm. In other words, the thickness of the metal portion 31 $D_{2-r}$ and the thickness of the metal portion 32 $D_{2-b}$ are both approximately between 5 nm to 20 nm.

The organic material layer 4 is formed above the metal portions 31 and 32 and the portion of the surface 21 that is exposed from the opening portion 33. This embodiment does not limit the material of the organic material layer 4, which is usually fluorescent or phosphorescent, such as a green fluorescent material $Alq_3$. In this embodiment, when one of the substrate layer 2 and the first metal layer 3 acts as the anode and the second metal layer 5 acts as the cathode, the organic material layer 4 includes a hole injection layer/hole transport layer (HIL/HTL) 41, a light emitting layer 42, and an electron transport layer/electron injection layer (ETL/EIL) 43 sequentially stacked from the anode to the cathode. When the second metal layer 5 is used as an anode, the substrate layer 2 or the first metal layer 3 is used as a cathode. The layers 41-43 in the organic material layer 4 may be stacked reversely. In this embodiment, the thickness of the organic material layer 4, i.e., the distance between the first metal layer 3 and the second metal layer 5 or the distance $D_{1-r}$ between the metal portion 31 and the second metal layer 5, the distance $D_{1-b}$ between the metal portion 32 and the second metal layer 5, and the thickness $D_{1-g}$ of the organic material layer 4 corresponding to the opening portion 33 are approximately between 75 nm to 150 nm.

The second metal layer 5 is formed on the organic material layer 4, such that the organic material layer 4 is disposed between the first metal layer 3 and the second metal layer 5. The material of the second metal layer 5 in this embodiment may be metal (e.g., aluminum or its alloy, silver or its alloy, gold or its alloy), such as Al/LiF, Ag/Al/Ag, Ag/Ge/Ag, or nano metal oxide, such as $BCP/V_2O_5$, $MoO_3$, ZnS/Ag/ZnO/Ag, $ZnPc/C_{60}$. The second metal layer 5 is generally used as the cathode. In this embodiment, the thickness of the second metal layer 5 is more than about 20 nm.

When a voltage is applied across the second metal layer 5 and one of the first metal layer 3 and the substrate layer 2, the electrons and the holes travel from the anode and the cathode towards the light emitting layer 42, respectively, and combine to emit light for the organic material layer 4. The peak wavelength of the light emitted is within a first range. Moreover, a first coupling is generated between the metal portion 31 and the second metal layer 5 separated by the organic material layer 4, and is called Plasmon coupling effect. As a result, the peak wavelength of the light is shifted from the first range to a second range. Moreover, a second coupling is generated between the metal portion 32 and the second metal layer 5 separated by the organic material layer 4, and shifts the peak wavelength of the light from the first range to a third range.

It should be noted that the light emitted by the organic material layer 4 is isotropic, and when the second metal layer 5 is reflective, light with the peak wavelength within the first range may pass through the opening portion 33 and exit the light emitting element 100; light with the peak wavelength in the second range may pass through the metal portion 31 and exit the light emitting element 100; and light with the peak wavelength in the third range may pass through the metal portion 32 and exit the light emitting element 100. When the second metal layer 5 is transparent, light with peak wavelengths in the first, the second and the third ranges may also pass through the second metal layer 5 and exit the light emitting element 100.

In addition, by adjusting the thickness $D_{2-r}$ of the metal portion 31, the thickness of the second metal layer 5, or the distance $D_{1-r}$ between the metal portion 31 and the second metal layer 5, the second range can be changed. By adjusting the thickness $D_{2-b}$ of the metal portion 32, the thickness of the second metal layer 5, or the distance $D_{1-b}$ between the metal portion 32 and the second metal layer 5, the third range can be changed.

As shown in FIG. 1, the thickness $D_{2-r}$ of the metal portion 31 is not the same as the thickness $D_{2-b}$ of the metal portion 32, whereas the distance $D_{1-r}$ between the metal portion 31 and the second metal layer 5, the distance $D_{1-b}$ between the metal portion 32 and the second metal layer 5, and the distance $D_{1-g}$ between the second metal layer 5 and the substrate layer 2 corresponding to where the opening portion 33 is, are the same. That is, the overall thickness of the organic material layer 4 is uniform, and the overall thickness of the second metal layer 5 is uniform. As shown in FIGS. 2 and 3, the thickness $D_{2-r}$ of the metal portion 31 is the same as the thickness $D_{2-b}$ of the metal portion 32, whereas the distance $D_{1-r}$ between the metal portion 31 and the second metal layer 5 and the distance $D_{1-b}$ between the metal portion 32 and the second metal layer 5 are not the same. In FIG. 2, the light emitting layer 42 is essentially used to adjust the distance $D_{1-r}$ between the metal portion 31 and the second metal layer 5 and the distance $D_{1-b}$ between the metal portion 32 and the second metal layer 5, while the thickness of the HIL/HTL 41, the thickness of the ETL/EIL 43, and the thickness of the second metal layer 5 are uniform. In FIG. 3, the HIL/HTL 41 is essentially used to adjust the distance $D_{1-r}$ between the metal portion 31 and the second metal layer 5 and the distance $D_{1-b}$ between the metal portion 32 and the second metal layer 5, while the thickness of the light emitting layer 42, the thickness of the ETL/EIL 43, and the thickness of the second metal layer 5 are uniform. Furthermore, the ETL/EIL 43 can also be used to adjust the distance $D_{1-r}$ between the metal portion 31 and the second metal layer 5 and the distance $D_{1-b}$ between the metal portion 32 and the second metal layer 5.

For example, the peak wavelength of the light emitting by the organic material layer 4 is between 495-570 nm (green light band), the thickness $D_{2-r}$ of the metal portion 31 is about 5-20 nm and spaced from the second metal layer 5 at a distance $D_{1-r}$ that is about 75-150 nm, a first coupling is generated between the metal portion 31 and the second metal layer 5 to shift the peak wavelength of the light to 570-750 nm (red light band), the thickness $D_{2-b}$ of the metal portion 32 is about 5-20 nm and spaced from the second metal layer 5 at a distance $D_{1-b}$ that is about 75-150 nm, the thickness $D_{2-b}$ of the metal portion 32 is greater than the thickness $D_{2-r}$ of the metal portion 31 or the distance $D_{1-b}$ between the metal portion 32 and the second metal layer 5 is less than the distance $D_{ir}$ between the metal portion 31 and the second metal layer 5, and a second coupling is generated between the metal portion 32 and the second metal layer 5 to shift the peak wavelength of the light to 380-495 nm (blue light band). For another example, the peak wavelength of the light emitted by the organic material layer 4 is between 570-750 nm, the thickness $D_{2-r}$ of the metal portion 31 is about 5-20 nm and spaced from the second metal layer 5 at a distance $D_{1-r}$ that is about 150-1000 nm, a first coupling is generated between the metal portion 31 and the second metal layer 5 to shift the peak wavelength of the light to be less than 1240 nm, the thickness $D_{2-b}$ of the metal portion 32 is about 5-20 nm and is spaced from the second metal layer 5 at a distance $D_{1-b}$ that is about 30-75 nm, and a second coupling is generated between the metal portion 32 and the second metal layer 5 to shift the peak wavelength of the light to be greater than 305 nm. Therefore, the light emitting element 300 emits light having three bands, including red light, green light and blue light, which are mixed to be white light. Besides, the ratio of the green light, red light and blue light can be changed by adjusting the areas of the metal portions 31 and 32 that cover the surface 21 of the substrate 2 and the area of the exposed surface of the opening portion 33.

Figure 4:
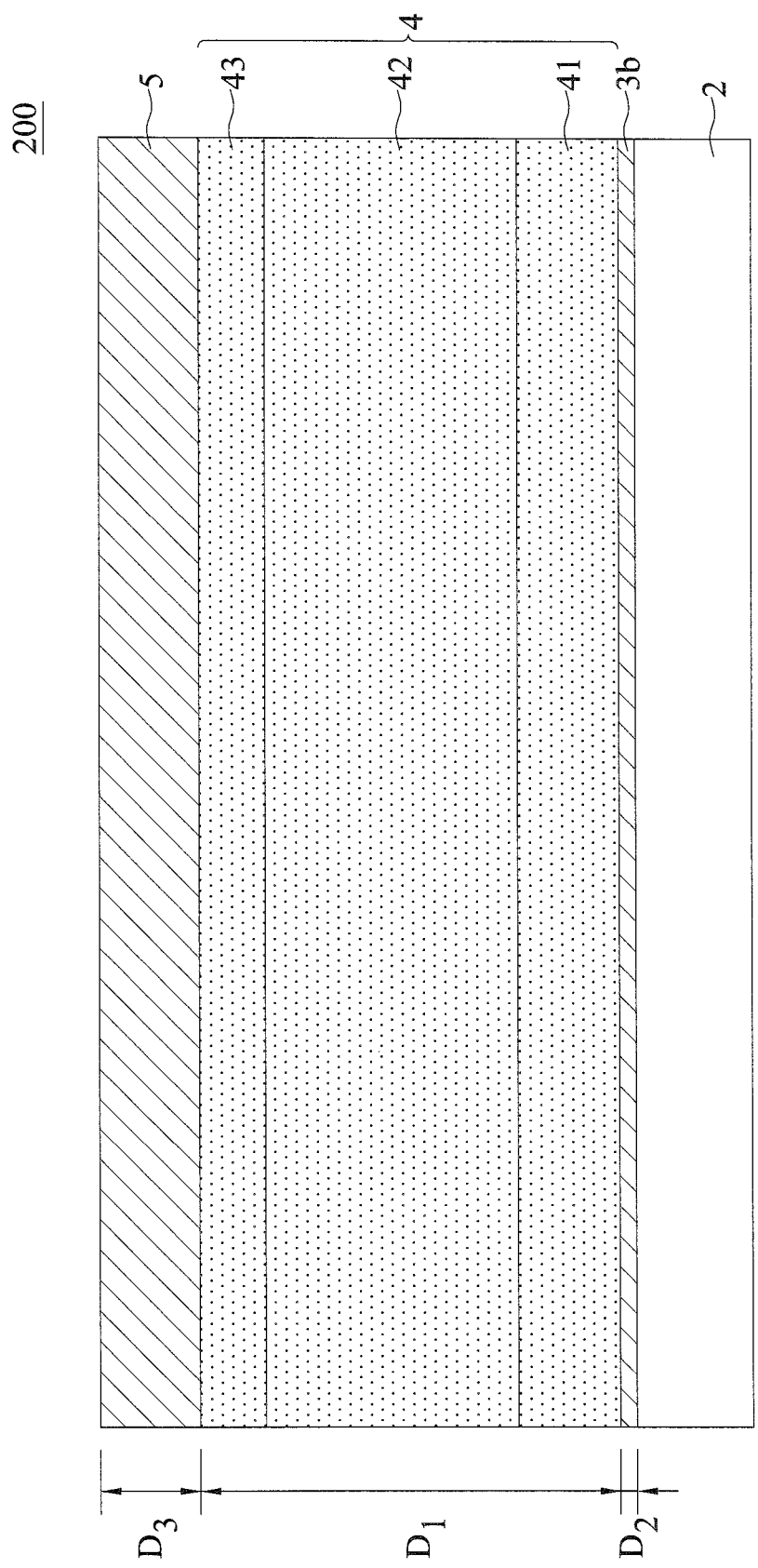
FIG. 4 is schematic diagram illustrating a light emitting element in accordance with a second embodiment of the present disclosure.

Referring to FIG. 4, which is a schematic diagram of a light emitting element 200 of a second embodiment according to the present invention. The light emitting element 200 differs from the first embodiment in the first metal layer 3b.

The first metal layer 3b is formed on the substrate 2 and does not include any opening portion. The substrate 2 and the first metal layer 3b are made of the same material as those used in the first embodiment. The first metal layer 3b is thick enough to cover the whole surface of the substrate 2.

The peak wavelength of the light emitting by the organic material layer 4 is within the first range, and a first coupling is generated between the first metal layer 3b and the second metal layer 5 to shift the peak wavelength of the light from the first range to the second range. When the substrate layer 2 acts as the anode and the second metal layer 5 acts as the cathode, the organic material layer 4 further includes the HIL/HTL 41, the light emitting layer 42, and an ETL/EIL 43 sequentially stacked from the anode to the cathode.

For example, when the first range is the green light band (about 495-570 nm), the thickness $D_2$ of the first metal layer $3b$ is 5-20 nm, the thickness $D_3$ of the second metal layer $5$ is greater than 20 nm, and the distance $D_1$ between the first metal layer $3b$ and the second metal layer $5$ is 75-150 nm, the second range is the red light band (about 570-750 nm). For another example, when the first range is 570-750 nm, the thickness $D_2$ of the first metal layer $3b$ is about 5-20 nm, and the distance $D_1$ between the first metal layer $3b$ and the second metal layer $5$ is about 150-1000 nm, the second range is greater than the first range and less than 1240 nm.

Tables 1-11 below show the relation between the thickness of the layers and the peak wavelength of the light emitted by the organic material layer. The distance between the first metal layer and the second metal layer is represented as $D_1$ (i.e., the generic term for the distance $D_{1-r}$ between the metal portion $31$ and the second metal layer $5$, and the distance $D_{1-b}$ between the metal portion $32$ and the second metal layer $5$), the thickness of the first metal layer $3$ is represented as $D_2$ (i.e., the generic term for the thickness $D_{2-r}$ of the metal portion $31$ and the thickness $D_{2-b}$ of the metal portion $32$). The thickness of the second metal layer is represented by $D_3$.

It should be noted that in Table 1 below, the material used for the organic material layer is the green fluorescent material Alq$_3$, and the materials used for the first metal layer and the second metal layer are Al/Al, Ag/Ag, Au/Au, and Al/Al, respectively.

When the distance $D_1$ between the first metal layer and the second metal layer becomes smaller and the thickness $D_2$ of the first metal layer becomes larger, the peak wavelength of the light is shifted towards the blue light band and the light becomes blue light. This phenomenon is called "blue shift." As a result, the light emitting element is capable of emitting white light made of the green, the red and the blue light.

Figure 7:
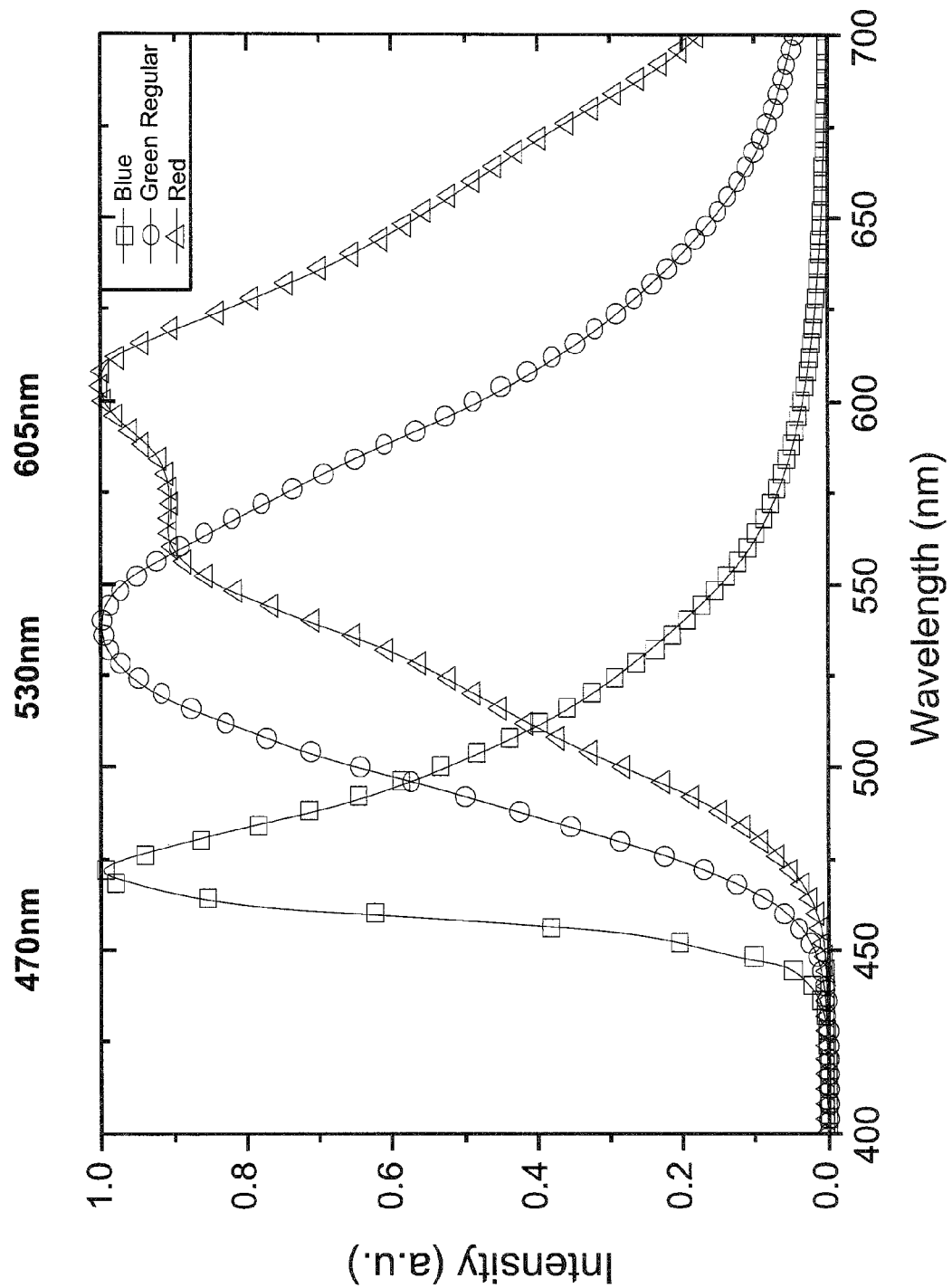
FIG. 7 is a graph illustrating an experiment conducted for a light emitting element according to the present disclosure.

As shown in FIG. 7, the organic material layer is Alq$_3$, the first metal layer/the second metal layer are Al/Al, the light emitted by the organic material layer basically covers the visible light band (e.g., 380 nm to 750 nm), and by adjusting the thickness $D_2$ of the first metal layer and the distance $D_1$ between the first metal layer and the second metal layer as mentioned above, its peak wavelength can be red shifted to 605 nm and blue shifted to 470 nm

TABLE 4

| $D_1$(nm) | 70 | 114 | 126 |
|---|---|---|---|
| $D_2$(nm) | 21.27 | 21.27 | 21.27 |
| $D_3$(nm) | 217 | 217 | 217 |

Figure 8:
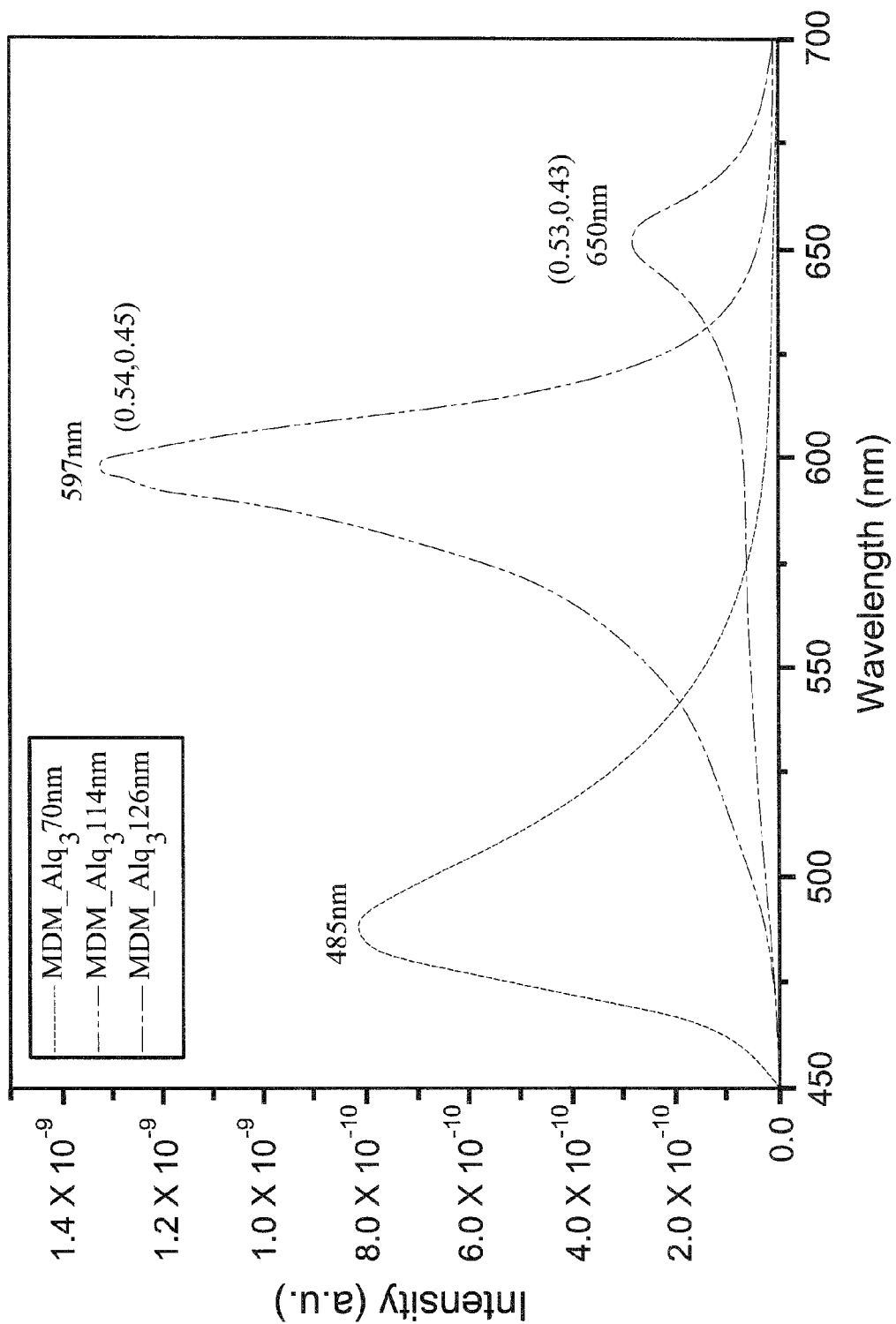
FIG. 8 is a graph illustrating another experiment conducted for a light emitting element according to the present disclosure.

Referring to FIG. 8, the result of the shifting of the peak wavelength in Table 4 is shown. As shown in FIG. 8, as the distance $D_1$ between the first metal layer and the second metal layer becomes larger, the peak wavelength of the light is shifted more towards the red light band; as the distance $D_1$

TABLE 1

| | D1(nm) | | | | | | | | | | | | | |
|---|---|---|---|---|---|---|---|---|---|---|---|---|---|---|
| D2(nm) | 75 | 80 | 85 | 90 | 95 | 100 | 105 | 110 | 115 | 120 | 125 | 130 | 140 | 150 |
| 5 | 413 | 420 | 473 | 492 | 512 | 530 | 548 | 566 | 584 | 602 | 619 | 637 | 674 | 712 |
| 10 | 413 | 432 | 445 | 458 | 473 | 488 | 504 | 519 | 535 | 551 | 567 | 583 | 616 | 649 |
| 15 | 376 | 425 | 438 | 450 | 462 | 476 | 491 | 506 | 521 | 536 | 552 | 567 | 599 | 632 |
| 20 | 374 | 422 | 435 | 446 | 457 | 471 | 485 | 500 | 515 | 530 | 546 | 561 | 593 | 625 |

TABLE 2

| | D1(nm) | | | | | | | | | | | | | |
|---|---|---|---|---|---|---|---|---|---|---|---|---|---|---|
| D2(nm) | 75 | 80 | 85 | 90 | 95 | 100 | 105 | 110 | 115 | 120 | 125 | 130 | 140 | 150 |
| 10 | 462 | 492 | 513 | 531 | 544 | 567 | 594 | 621 | 629 | 645 | 658 | 673 | 711 | 740 |
| 15 | 466 | 484 | 502 | 517 | 533 | 547 | 565 | 582 | 600 | 616 | 632 | 647 | 678 | 711 |
| 20 | 463 | 478 | 493 | 508 | 523 | 538 | 553 | 568 | 584 | 600 | 616 | 632 | 662 | 693 |

TABLE 3

| | D1(nm) | | | | | | | | | | | | | |
|---|---|---|---|---|---|---|---|---|---|---|---|---|---|---|
| D2(nm) | 75 | 80 | 85 | 90 | 95 | 100 | 105 | 110 | 115 | 120 | 125 | 130 | 140 | 150 |
| 10 | 480 | 480 | 479 | 523 | 559 | 573 | 591 | 607 | 673 | 684 | 696 | 708 | 735 | 762 |
| 15 | 515 | 526 | 535 | 548 | 559 | 572 | 591 | 609 | 652 | 665 | 675 | 685 | 707 | 732 |
| 20 | 518 | 526 | 535 | 545 | 555 | 567 | 584 | 603 | 652 | 652 | 663 | 673 | 693 | 716 |

The peak wavelength of the light emitted by the organic material layer is around 530 nm. As can be seen from Table 1, when the distance $D_1$ between the first metal layer and the second metal layer becomes larger and the thickness $D_2$ of the first metal layer becomes smaller, the peak wavelength of the light is shifted towards the red light band and the light becomes red light. This phenomenon is called "red shift."

Tables 5-8 below demonstrate simulation results of red shift from red light band (630 nm) for different materials of the first metal layer and the second metal layer with N(refractive index)/K(extinction coefficient) set to 1.75. The first metal layer and the second metal layer in Tables 5-7 are made of Al/Al, Ag/Ag, and Au/Au, respectively.

TABLE 5

| D2(nm) | D1(nm) | | | | | | | |
|---|---|---|---|---|---|---|---|---|
| | 150 | 200 | 250 | 300 | 350 | 400 | 450 | 500 |
| 5 | 816 | 1024 | >1200 | >1200 | 734 | 828 | 922 | 1006 |
| 10 | 740 | 915 | 1081 | >1200 | 708 | 790 | 873 | 957 |
| 15 | 711 | 872 | 1038 | >1200 | 693 | 773 | 854 | 936 |
| 20 | 693 | 853 | 1017 | 1182 | 684 | 764 | 845 | 926 |

TABLE 6

| D2(nm) | D1(nm) | | | | | | | |
|---|---|---|---|---|---|---|---|---|
| | 150 | 200 | 250 | 300 | 350 | 400 | 450 | 500 |
| 5 | 712 | 928 | 1158 | 606 | 691 | 785 | 886 | 968 |
| 10 | 649 | 880 | 1034 | 583 | 663 | 749 | 857 | 934 |
| 15 | 632 | 860 | 996 | 575 | 655 | 739 | 843 | 920 |
| 20 | 625 | 851 | 983 | 572 | 651 | 735 | 837 | 913 |

TABLE 7

| D2(nm) | D1(nm) | | | | | | | |
|---|---|---|---|---|---|---|---|---|
| | 150 | 200 | 250 | 300 | 350 | 400 | 450 | 500 |
| 5 | 850 | 1021 | 1189 | >1200 | 750 | 834 | 919 | 1004 |
| 10 | 762 | 914 | 1074 | >1200 | 721 | 796 | 875 | 956 |
| 15 | 732 | 876 | 1035 | 1195 | 707 | 779 | 856 | 936 |
| 20 | 716 | 856 | 1015 | 1175 | 699 | 770 | 847 | 926 |

TABLE 8

| $D_1$(nm) | Wavelength (nm) |
|---|---|
| 200 | 500 |
| 500 | 850 |
| 1000 | 1240 |

As can be seen from Tables 5-8, the thickness $D_2$ of the first metal layer can be adjusted between 5-20 nm, the distance $D_1$ between the first metal layer and the second metal layer can also be adjusted between 150-500 nm, and even when 1000 nm, the light can be shifted from the red light band (570-750 nm) to the infrared light band (about less than 1240 nm). In particular, as can be seen from Table 8, when the distance $D_1$ between the first metal layer 3b and the second metal layer 5 is 200 nm, 500 nm, or 1000 nm, the light emitting element may emit light in the peak wavelength of about 500 nm, 850 nm or 1024 nm.

Tables 9-11 below list that the peak wavelength of the light emitted by the organic material layer is between about 570-750 nm, and the first metal layer and the second metal layer are made of Al/Al, Ag/Ag and Au/Au.

TABLE 9

| $D_2$(nm) | $D_1$(nm) | | | | | |
|---|---|---|---|---|---|---|
| | 30 | 40 | 50 | 60 | 70 | 75 |
| 5 | — | — | 325 | 365 | 400 | 413 |
| 10 | — | — | 311 | 341 | 371 | 413 |
| 15 | — | — | 305 | 333 | 359 | 376 |
| 20 | — | — | 303 | 330 | 355 | 374 |

TABLE 10

| $D_2$(nm) | $D_1$(nm) | | | | | |
|---|---|---|---|---|---|---|
| | 30 | 40 | 50 | 60 | 70 | 75 |
| 5 | 305 | 380 | 388 | 395 | 395 | 310 |
| 10 | 305 | 365 | 390 | 409 | 410 | 310 |
| 15 | 333 | 354 | 386 | 415 | 436 | 310 |
| 20 | 335 | 352 | 382 | 419 | 448 | 310 |

TABLE 11

| $D_2$(nm) | $D_1$(nm) | | | | | |
|---|---|---|---|---|---|---|
| | 30 | 40 | 50 | 60 | 70 | 75 |
| 5 | 0 | 365 | 400 | 405 | 465 | 400 |
| 10 | 428 | 441 | 456 | 472 | 480 | 410 |
| 15 | 450 | 463 | 478 | 491 | 506 | 515 |
| 20 | 460 | 473 | 485 | 497 | 511 | 518 |

It is known from Tables 9-11 that the thickness $D_2$ of the first metal layer can be adjusted between 5-20 nm, the distance $D_1$ between the first metal layer and the second metal layer can also be adjusted between 30-75 nm, and the light can be shifted from the red light band (570-750 nm) to the near ultraviolet light (greater than about 305 nm).

Figure 5:
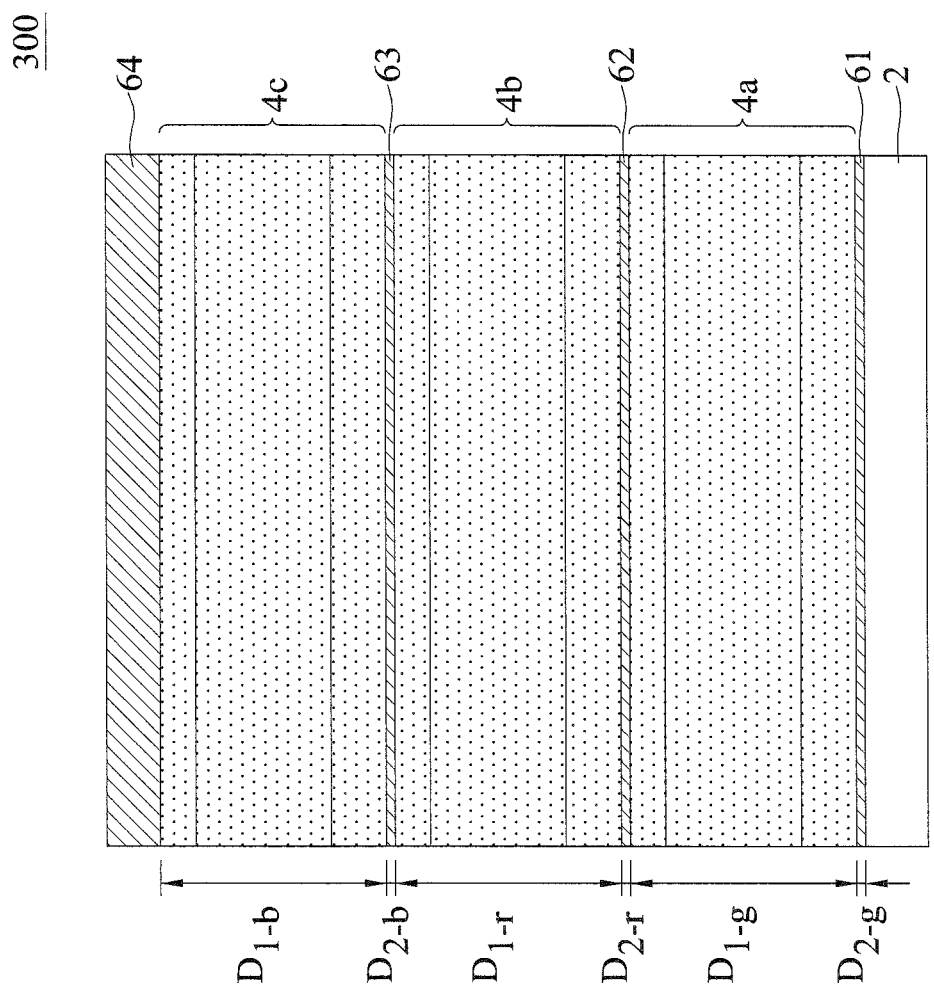
FIG. 5 is schematic diagram illustrating a light emitting element in accordance with a third embodiment of the present disclosure.

Referring to FIG. 5, a schematic diagram illustrating a light emitting element in accordance with a third embodiment of the present disclosure is shown. In this embodiment, a light emitting element 300 includes a substrate layer 2, a first metal layer 61, a first organic material layer 4a, a second metal layer 62, a second organic material layer 4b, a third metal layer 63, a third organic material layer 4c and a fourth metal layer 64 sequentially stacked.

The size and the material of the substrate layer 2 are the same as those of the substrate layer 2 in the first embodiment.

The sizes and the materials of the first metal layer 61, the second metal layer 62, and the third metal layer 63 are the same as those of the first metal layer 3 in the first embodiment. For example, the thickness may be between 5 nm and 20 nm, and the material may be metal (e.g., Al/LiF, Ag/Al/Ag, Ag/Ge/Ag) or nano metal oxide (e.g., BCP/$V_2O_5$, $MoO_3$, ZnS/Ag/ZnO/Ag, ZnPc/$C_{60}$). The sizes and the materials of the fourth metal layer 64 are the same as those of the second metal layer 5 described in the first embodiment. It is similarly used as the cathode. One of the substrate layer 2 and the first metal layer 61 can be used as an anode.

The first organic material layer 4a, the second organic material layer 4b, and the third organic material layer 4c are the same as the organic material layer 4 in the first embodiment, such as the green fluorescent material $Alq_3$.

The peak wavelengths of a first light emitted by the first organic material layer 4a, a second light emitted by the second organic material layer 4b, and a third light emitted by the third organic material layer 4c are all within a first range. The first metal layer 61 and the second metal layer 62 produces gain for the first light. A second coupling is generated between the second metal layer 62 and the third metal layer 63, such that the peak wavelength of the second light is shifted from the first range to a second range. A third coupling is generated between the third metal layer 63 and the fourth metal layer 64, such that the peak wavelength of the third light is shifted from the first range to a third range.

The gain of the first light can be changed by adjusting the thickness $D_{2-g}$ of the first metal layer 61, the thickness $D_{2-r}$ of the second metal layer 62, or the distance $D_{1-g}$ between the first metal layer 61 and the second metal layer 62. The second range can be changed by adjusting the thickness $D_{2-r}$ of the second metal layer 62, the thickness $D_{2-b}$ of the third metal layer 63, or the distance $D_{1-r}$ between the second metal layer 62 and the third metal layer 63. The third range can be changed by adjusting the thickness $D_{2-b}$ of the third metal layer 63, the thickness of the fourth metal layer 64, or the distance $D_{1-b}$ between the third metal layer 63 and the fourth metal layer 64.

For example, the peak wavelength of the first, second and third light is between 495-570 nm, wherein the wavelength band of the second light covers 495-750 nm, the wavelength band of the third light covers 380-570 nm After a second coupling between the second metal layer 62 and the third metal layer 63 is generated, the thicknesses $D_{2-r}$ and $D_{2-b}$ of which are between 5-20 nm and which are spaced at a distance $D_{1-r}$ that is between 70-150 nm, the peak wavelength of the second light is shifted to 570-750 nm. After a third coupling between the third metal layer 63 and the fourth metal layer 64 is generated, which are spaced at a distance $D_{1-b}$ that is between 70-150 nm and less than $D_{1-r}$, the peak wavelength of the third light is shifted to 380-495 nm. For another example, the peak wavelength of the first, second and third light is between 570-750 nm, wherein the wavelength band of the second light covers 570-1240 nm, the wavelength band of the third light covers 305-750 nm After a second coupling between the second metal layer 62 and the third metal layer 63 is generated, the thicknesses $D_{2-r}$ and $D_{2-b}$ of which are between 5-20 nm and which are spaced at a distance $D_{1-r}$ that is between 150-1000 nm, the peak wavelength of the second light is shifted to be less than 1240 nm. After a third coupling between the third metal layer 63 and the fourth metal layer 64 is generated, which are spaced at a distance $D_{1-b}$ that is between 30-75 nm and less than $D_{1-r}$, the peak wavelength of the second light is shifted to be greater than 305 nm. Therefore, the light emitting element 300 generates light that includes green red and blue bands, and emits white light constituted by the light of the three bands.

Figure 6:
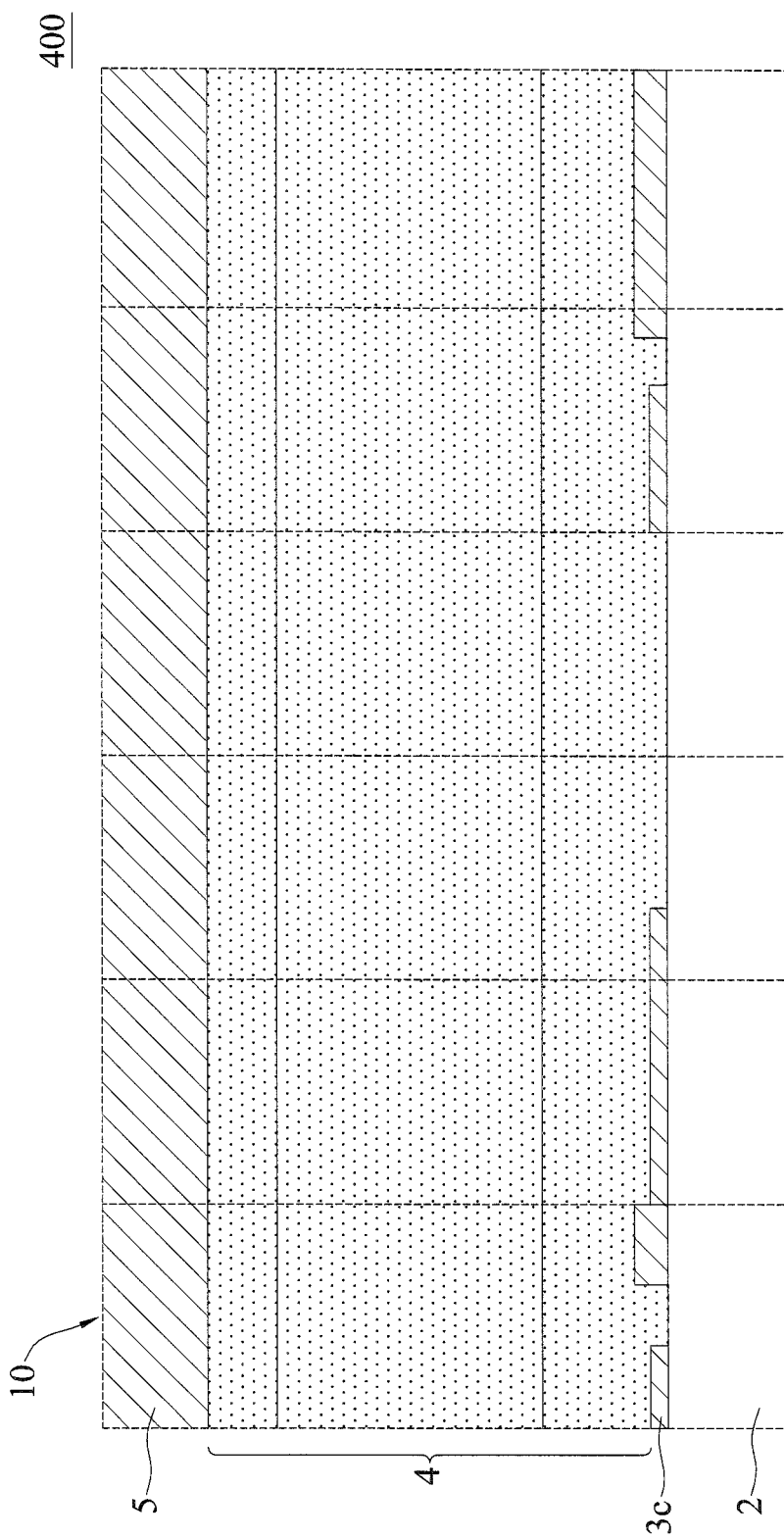
FIG. 6 is schematic diagram illustrating a light emitting element in accordance with a fourth embodiment of the present disclosure.

Referring to FIG. 6, a schematic diagram illustrating a light emitting element in accordance with a fourth embodiment of the present disclosure is shown. A light emitting element 400 of the present disclosure includes a plurality of pixels 10. The organic material layer 4 emits light having a peak wavelength within a first range. Each pixel 10 includes a substrate layer 2, a first metal layer 3c, an organic material layer 4, and a second metal layer 5 sequentially stacked. The substrate layer 2, the organic material layer 4, and the second metal layer 5 are the same as those in the first embodiment the first metal layer 3c may be one of the following: the first metal layer 3c has a uniform thickness and covers a surface of the substrate 2 completely (the second or sixth pixel from the left-hand-side of FIG. 6), a peak wavelength of the light is shifted from the first range to the second range by adjusting the thickness of the first metal layer 3c to be less or a distance between the first metal layer 3c and the second metal layer 5 to be greater, or the peak wavelength of the light is shifted from the first range to the third range by adjusting the thickness of the first metal layer 3c to be greater or a distance between the first metal layer 3c and the second metal layer 5 to be less; the first metal layer 3c has a metal portion that covers a portion of the surface of the substrate 2 and an open portion that exposes a remaining portion of the surface of the substrate 2 (e.g., the third pixel from the left-hand-side of FIG. 6), the peak wavelength of the light is shifted from the first range to the second range by adjusting the thickness of the metal portion to be less or a distance between the metal portion and the second metal layer 5 to be greater, or the peak wavelength of the light is shifted from the first range to the third range by adjusting the thickness of the metal portion to be greater or a distance between the metal portion and the second metal layer 5 to be less; the first metal layer 3c has a first metal portion and a second metal portion, the peak wavelength of the light is shifted from the first range to the second range by adjusting the thickness of the first metal portion to be less or a distance between the first metal portion and the second metal layer 5 to be greater, or the peak wavelength of the light is shifted from the first range to the third range by adjusting the thickness of the second metal portion to be greater or a distance between the second metal portion and the second metal layer 5 to be less; the first metal layer 3c has a first metal portion, a second metal portion, and an open portion formed on a portion of the surface of the substrate 2 between the first metal portion and the second metal portion (e.g., the first or fifth pixel from the left-hand-side of FIG. 6), the peak wavelength of the light is shifted from the first range to the second range by adjusting the thickness of the first metal portion to be less or a distance between the first metal portion and the second metal portion to be greater, or the peak wavelength of the light is shifted from the first range to the third range by adjusting the thickness of the first metal portion to be greater or a distance between the first metal portion and the second metal portion to be less; and the first metal layer 3c has zero thickness (e.g., the fourth pixel from the left-hand-side of FIG. 6), and the original wavelength is not shifted.

In this embodiment, the first range can be in the green light band (around 495 nm to 570 nm), and the second range can be in the red light band (around 570 nm to 750 nm), the blue light band (around 380 nm to 495 nm), or the white band composed of a mixture of red, green and blue light. As a result, each pixel 10 may emit light of any color, so the light emitting element 400 according to the present disclosure may display a full-color/grayscale image. In addition, in this embodiment, when the organic material layer 4 is deposited or coated on the first metal layer 3c, the organic material layer 4 may be coated in conformity with the pattern of the first metal layer 3c, such as that shown in FIG. 1.

Figure 9:
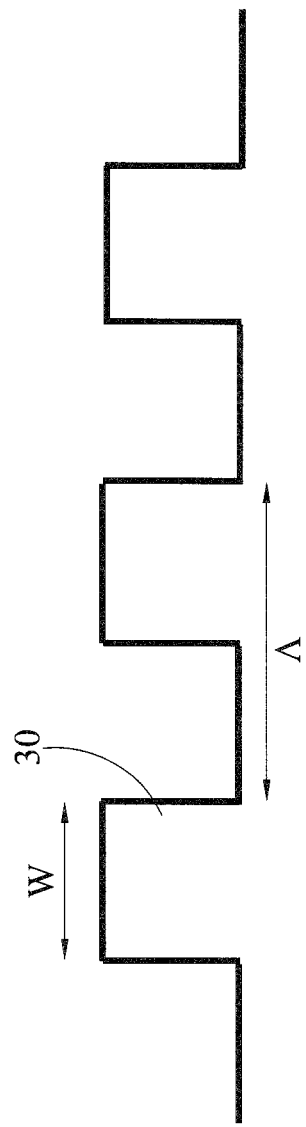
FIG. 9 shows a periodic structure included in a light emitting element according to the present disclosure.

Referring to FIG. 9, the metal portions 31 and 32 of the light emitting element 100 constitute a plurality of periodic structures such that the peak wavelengths of light within various ranges generate a gain. As shown in FIG. 9, the periodic structures have a size W between 40 nm and 437 nm, and a period Λ between 50 nm and 965 nm. In other words, each of the widths of the metal portions 31 and 32 is the width W of the periodic structure 30, and the period Λ of the periodic structure 30 is from the end of the metal portion 31 to the end of the metal portion 32. Though shown as a square waveform in FIG. 9, the shape of the periodic structure is not limited thereto. Therefore, the red shifted or blue shifted light generated due to the plasma coupling effect or the original light that is not shifted (first range), can generate a gain through the periodic structure 30.

Tables 12-14 list the relations among the periods Λ, sizes W and applied wavelengths of the basic units that are Al, Ag and Au.

TABLE 12

| Wavelength(nm) | 340 | 400 | 450 | 500 | 550 | 600 | 650 | 700 | 750 | 800 |
|---|---|---|---|---|---|---|---|---|---|---|
| Period (nm) | | 348 | 435 | 507 | 579 | 646 | 714 | 778 | 845 | 910 | 965 |
| Size (nm) | | 170 | 208 | 237 | 268 | 298 | 327 | 345 | 383 | 411 | 437 |

TABLE 13

| Wavelength (nm) | 380 | 400 | 450 | 500 | 550 | 600 | 650 | 700 | 750 | 800 |
|---|---|---|---|---|---|---|---|---|---|---|
| Period (nm) | 50 | 171 | 300 | 392 | 466 | 534 | 596 | 657 | 716 | 773 |
| Size (nm) | 40 | 124 | 189 | 229 | 267 | 300 | 334 | 365 | 398 | 429 |

TABLE 14

| Wavelength (nm) | 510 | 525 | 550 | 600 | 650 | 700 | 750 | 800 |
|---|---|---|---|---|---|---|---|---|
| Period (nm) | 62 | 223 | 462 | 462 | 545 | 615 | 680 | 738 |
| Size (nm) | 45 | 157 | 209 | 260 | 299 | 326 | 356 | 382 |

Figure 10A:
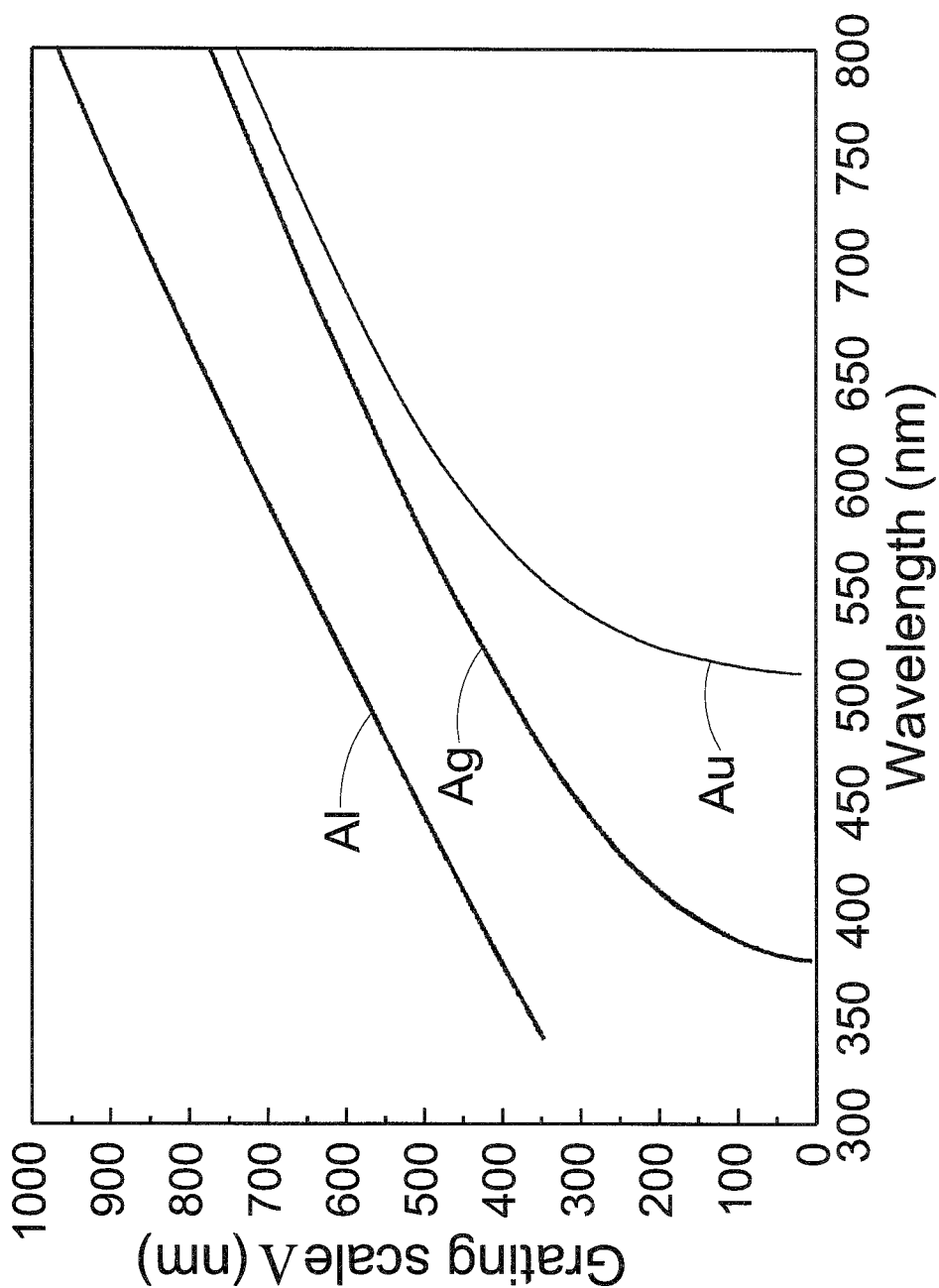
FIGS. 10A and 10B are relation curve graphs of the periodic structure and applied wavelengths according to the present disclosure.
Figure 10B:
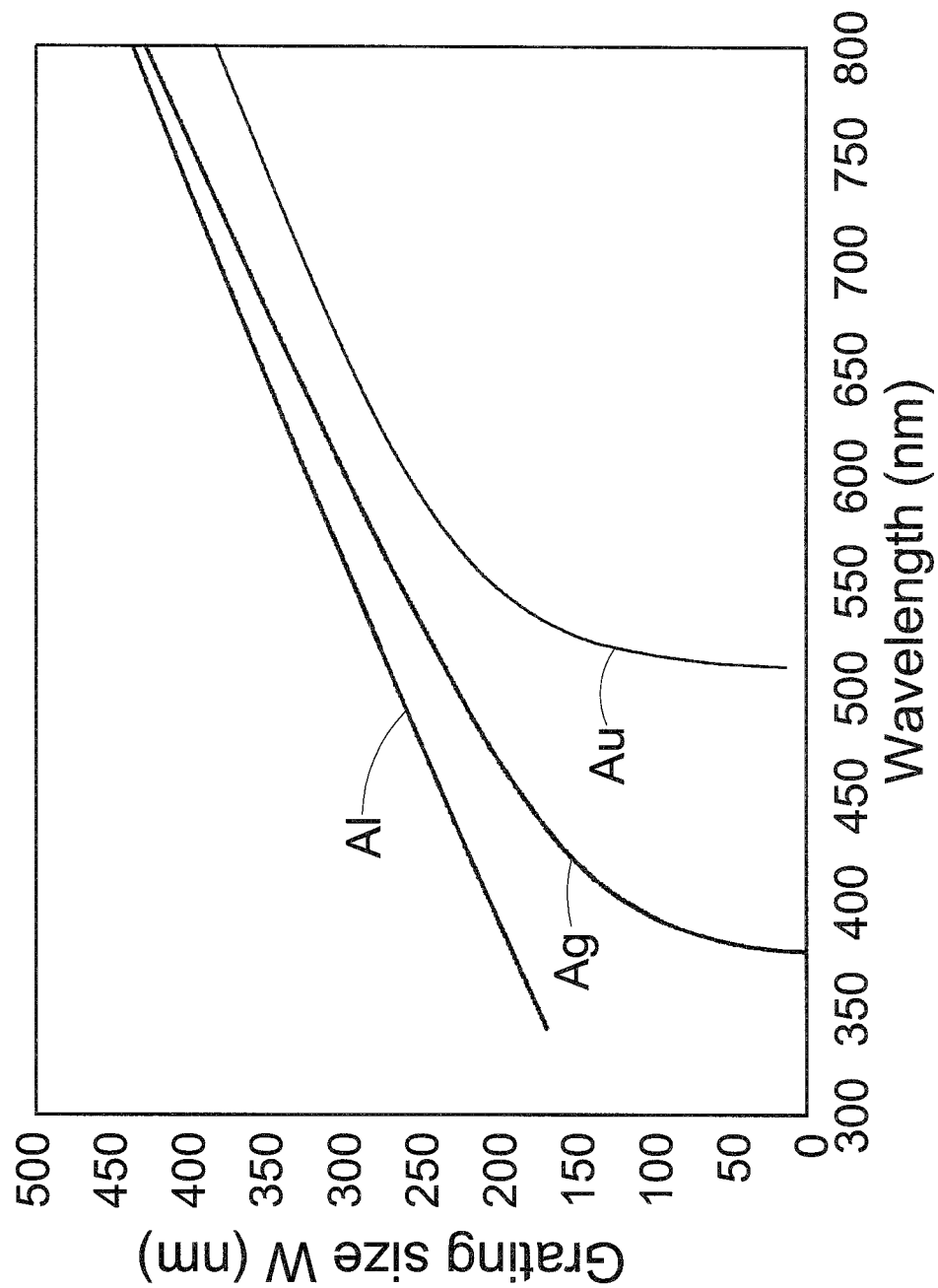

Referring to tables 12-14 and FIGS. 10A and 10B, the graphs shown in FIGS. 10A and 10B represent, from top to bottom, Al, Ag and Au, respectively. When the material is Al, the wavelength is 550 nm (green light), and the period Λ and the size W of the basic units of the periodic structure are 646 nm and 298 nm, respectively, the light having a peak wavelength equal to 550 nm generates a gain. When the material is Ag, the wavelength is 450 nm (blue light), and the period Λ and the size W of the basic units of the periodic structure are 300 nm and 189 nm, respectively, the light having a peak wavelength equal to 450 nm generates a gain. When the material is Au, the wavelength is 650 nm (red light), and the period Λ and the size W of the basic units of the periodic structure are 545 nm and 299 nm, respectively, the light having a peak wavelength equal to 650 nm generates a gain. It is thus known from Table 14 that Au is suit for a gain of a long wavelength. The light having a peak wavelength within a certain wavelength segment generates a gain by adjusting the period Λ and the size W of the periodic structure.

Figure 11A:
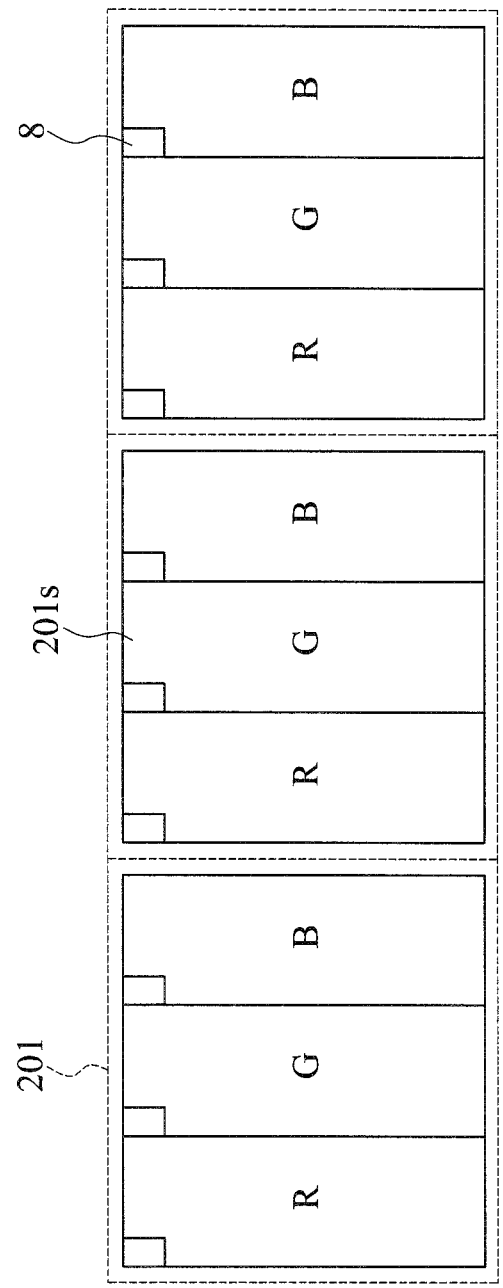
FIGS. 11A and 11B are schematic diagrams illustrating implementations of the light emitting elements according to the present disclosure.
Figure 11B:
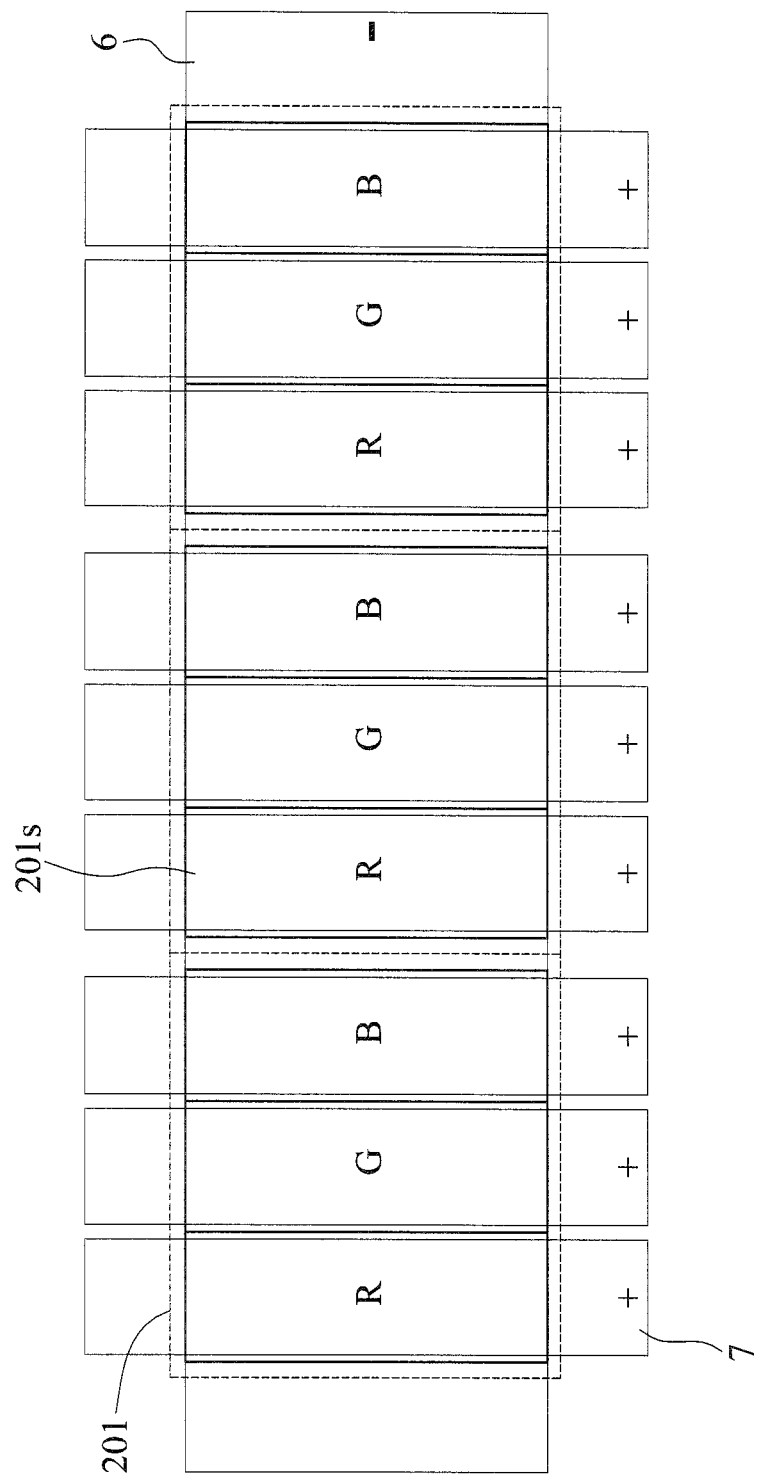

Furthermore, the light emitting element above can be applied to an Active-Matrix Organic Light-Emitting Diode (AMOLED) display or a Passive-Matrix Organic Light-Emitting Diode (PMOLED) display. Referring to FIG. 11A, the light emitting element 100 is used as a single pixel 201 in an AMOLED display. The pixel further includes three sub-pixels 201s (R, G, and B). Each sub-pixel 201s is actuated to emit light by a Thin-Film Transistor (TFT), allowing the pixel 201 to emit red, green and blue light. The luminous ratios of the R, G, and B sub-pixels 201s are adjusted through current control by the TFTs to thus control the color emitted by each pixel 201. As such, the AMOLED display is capable of displaying dynamic color/grayscale images. Referring to FIG. 11B, the difference between a PMOLED display of FIG. 11B and that of FIG. 11A is in the way the pixels are actuated to emit light, the PMOLED display uses a cathode 6 and an anode 7 for actuation of luminescence, whereas the rest of this display is the same as that shown in FIG. 11A.

In summary, by adjusting the thickness of the first metal layer, the distance between the first metal layer and the second metal layer, or even the thickness of the second metal layer, the light emitting element of the present disclosure is capable of emitting white light by shifting the peak wavelength of the light emitted by the organic material layer from a first range to a second or even a third range (red shifted or blue shifted).

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims

What is claimed is:
1. A light emitting element, comprising:
a substrate layer including a surface;
a first metal layer formed on the surface of the substrate layer and including a first metal portion and a second metal portion that cover a portion of the surface of the substrate layer and an opening portion that is formed between the first metal portion and the second metal portion and exposes a remaining portion of the surface;
an organic material layer formed on the first metal portion, the second metal portion, and the remaining portion of the surface that is exposed from the opening portion; and
a second metal layer formed on the organic material layer, such that the organic material layer is disposed between the first metal layer and the second metal layer,
wherein the organic material layer emits light that has a peak wavelength within a first range, a first coupling is generated between the first metal portion and the second metal layer and shifts the peak wavelength of the light from the first range to a second range, and a second coupling is generated between the second metal portion and the second metal layer and shifts the peak wavelength of the light from the first range to a third range, wherein the first range is between 495 nm and 570 nm, the second range is between 570 nm to 750 nm, and the third range is between 380 nm and 495 nm; or wherein the first range is between 570 nm and 750 nm, the second range is greater than the first range and less than 1240 nm, and the third range is less than the first range and greater than 305 nm.

2. The light emitting element of claim 1, wherein the second range is changed by adjusting a thickness of the first metal portion, a thickness of the second metal layer, or a distance between the first metal portion and the second metal layer, and the third range is changed by adjusting the thickness of the second metal portion, a thickness of the second metal layer, or the distance between the second metal portion and the second metal layer.

3. The light emitting element of claim 1, wherein the light has a wavelength covering a visible light band, when the first range is between 495 nm and 570 nm, the second range is between 570 nm to 750 nm, and the third range is between 380 nm and 495 nm.

4. The light emitting element of claim 1, wherein when the first range is between 495 nm and 570 nm, the second range is between 570 nm to 750 nm, and the third range is between 380 nm and 495 nm, the first metal portion has a thickness between 5 nm and 20 nm, the first metal portion and the second metal layer are spaced apart at a distance between 75 nm and 150 nm, the second metal portion has a thickness between 5 nm and 20 nm, the second metal portion and the second metal layer are spaced apart at a distance between 75 nm and 150 nm, wherein the thickness of the second metal portion is greater than the thickness of the first metal portion, or the distance between the second metal portion and the second layer is less than the distance between the first metal portion and the second metal layer.

5. The light emitting element of claim 1, wherein the light has a wavelength that covers from ultraviolet light band to near infrared light band, when the first range is between 570-750 nm, the second range is greater than the first range and less than 1240 nm, the third range is less than the first range and greater than 305 nm, thicknesses of the first metal portion and the second metal portion are between 5-20 nm, a distance between the first metal portion and the second metal layer is between 150-1000 nm, and a distance between the second metal portion and the second metal layer is between 30-75 nm.

6. The light emitting element of claim 1, wherein the substrate is made of glass, plastic or conductive metal oxide.

7. The light emitting element of claim 1, wherein the substrate layer or the first metal layer is an anode, the second metal layer is a cathode, and the organic material layer further includes a hole injection sublayer, a hole transport sublayer, a light emitting sublayer, an electron transport sublayer and an electron injection sublayer that are sequentially stacked from the anode to the cathode.

8. The light emitting element of claim 1, wherein the first metal layer and the second metal layer are made of metal or nano metal oxide.

9. The light emitting element of claim 1, wherein the first metal layer is a patterned metal layer or a grid-like metal layer.

10. The light emitting element of claim 1, wherein the first range is a green light band, the second range is a red light band, the third range is a blue light band, the light emitting element emits white light composed of green, red, and blue light, and a ratio of the green, the red, and the blue light is changed by adjusting the portion of the surface of the substrate layer that is covered by the first metal portion, and the second metal portion, and the remaining portion of the surface of the substrate layer that is exposed from the opening portion.

11. The light emitting element of claim 1, wherein the first metal portion or the second metal portion constitute a periodic structure, such that the peak wavelengths of the light within the first range, the second range or the third range generates a gain, and the periodic structure has a size between 40 nm and 437 nm and a period of the periodic structure is between 50 nm and 965 nm.

* * * * *